(12) United States Patent
Van Nostrand

(10) Patent No.: US 6,777,315 B1
(45) Date of Patent: Aug. 17, 2004

(54) METHOD OF CONTROLLING THE RESISTIVITY OF GALLIUM NITRIDE

(75) Inventor: Joseph E. Van Nostrand, Xenia, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/427,606

(22) Filed: May 1, 2003

Related U.S. Application Data

(60) Provisional application No. 60/387,244, filed on Jun. 4, 2002.

(51) Int. Cl.[7] .......................... H01L 21/20; H01L 21/36; H01L 21/3205
(52) U.S. Cl. ........................................ 438/478; 438/604
(58) Field of Search ................................. 438/478–481, 438/487, 495, 604; 117/108; 257/76, 189; 423/DIG. 39

(56) References Cited

U.S. PATENT DOCUMENTS

2003/0176003 A1 * 9/2003 Schaff et al. ................. 438/47

OTHER PUBLICATIONS

Yan et al. "Photoluminescence spectra of C60 molecules embedded in porous Si" Appl. Phy. Lett. 67 (23), Dec. 4, 1995.*

"Semi–insulating C–doped GaN and high–mobility AlGaN/GaN heterostructures grown by ammonia molecular beam epitaxy", Applied Physics Letters, vol. 75, No. 7, Aug. 16, 1999.

* cited by examiner

*Primary Examiner*—Craig A. Thompson
(74) *Attorney, Agent, or Firm*—Richard A. Lambert; Bobby D. Scearce; Thomas L. Kundert

(57) ABSTRACT

A method of controlling the resistivity of gallium nitride is disclosed. The method incorporates an MBE system and utilizes solid source gallium, gaseous source nitrogen and solid source Buckminster Fullerene $C_{60}$ as a carbon dopant for the GaN film. A desired, predetermined GaN film resistivity can be created during the growth process by selecting the temperature of the effusion cell containing the $C_{60}$ within a predetermined range so as to impart the desired resistivity in the GaN film.

7 Claims, 1 Drawing Sheet

US 6,777,315 B1

METHOD OF CONTROLLING THE RESISTIVITY OF GALLIUM NITRIDE

The present application is related to and claims priority on prior copending provisional Application No. 60/387,244, filed Jun. 4, 2002, entitled Method of Controlling the Resistivity of Gallium Nitride.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to Molecular Beam Epitaxy (MBE) techniques and more particularly to a MBE method of controlling the resistivity of Gallium Nitride films and epitaxial layers.

Gallium Nitride (GaN) is a semiconducting material which has great promise for use in electronic and optoelectronic devices. Semi-insulating to insulating GaN would be particularly useful in construction of high power, high frequency transmitters where it could be utilized to dramatically increase the power output of radar emitters, cell phones, and the like.

One technique for producing GaN films and epitaxial layers is MBE. While MBE is quite useful for the production of GaN epitaxial layers, the GaN epitaxial layers thus produced are generally very conductive. For many optoelectronic devices this is thought of as an advantage, but a shortcoming of this technique is that it doesn't lend itself to the growth of semi-insulating GaN, described above.

One method for increasing the resistivity of GaN films and epitaxial layers is to dope them with carbon. Carbon doped GaN epitaxial layers exhibit increased resistivity, rendering them suitable for use in the above mentioned high power applications. However, the carbon doping technique used today is difficult to reliably control, since it relies upon ionization of gasses such as methane or propane as the carbon source.

A need exists therefore for a reliable method for controlling the resistivity of GaN films and epitaxial layers. Such a method would be relatively simple and economical to effect yet provide consistent quality, semi-insulating GaN films.

SUMMARY OF THE INVENTION

Accordingly, it is a primary object of the present invention to provide a method of controlling the resistivity of GaN overcoming the limitations and disadvantages of the prior art.

Another object of the present invention is to provide a method of controlling the resistivity of GaN utilizing the reliable MBE technique.

Yet another object of the present invention is to provide an MBE method of controlling the resistivity of GaN to produce a semi-insulating GaN film having a preselected desired resistivity.

It is still another object of the present invention to provide a method of controlling the resistivity of GaN utilizing Buckminster Fullerene, $C_{60}$, as a source of material for carbon doping.

These and other objects of the invention will become apparent as the description of the representative embodiments proceeds.

In accordance with the foregoing principles and objects of the invention, a method of controlling the resistivity of GaN is described. According to the method of the present invention, an MBE system is utilized. MBE is a well known technique that produces consistent high quality results. Pursuant to the MBE process, GaN films and epitaxial layers are grown upon a substrate from raw materials provided from an effusion cell charged with gallium and a source of nitrogen. Advantageously, and according to an important aspect of the present invention, a desired, predetermined GaN film resistivity can be created during the growth process. More specifically, the temperature of the effusion cell containing the $C_{60}$ is selected from a predetermined range so as to impart the desired resistivity to the GaN film.

It has been determined that the use of $C_{60}$ in conjunction with varying its effusion cell temperature advantageously provides a resistive GaN film, useful in a wide variety of devices. The range of effusion cell temperatures is relatively narrow, yet the method of the present invention provides for a wide range of film resistivity values. Thus, the method of controlling the resistivity of GaN of the present invention reliably produces semi-insulating to insulating GaN films and epitaxial layers, something not possible by the methods of the prior art.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1:
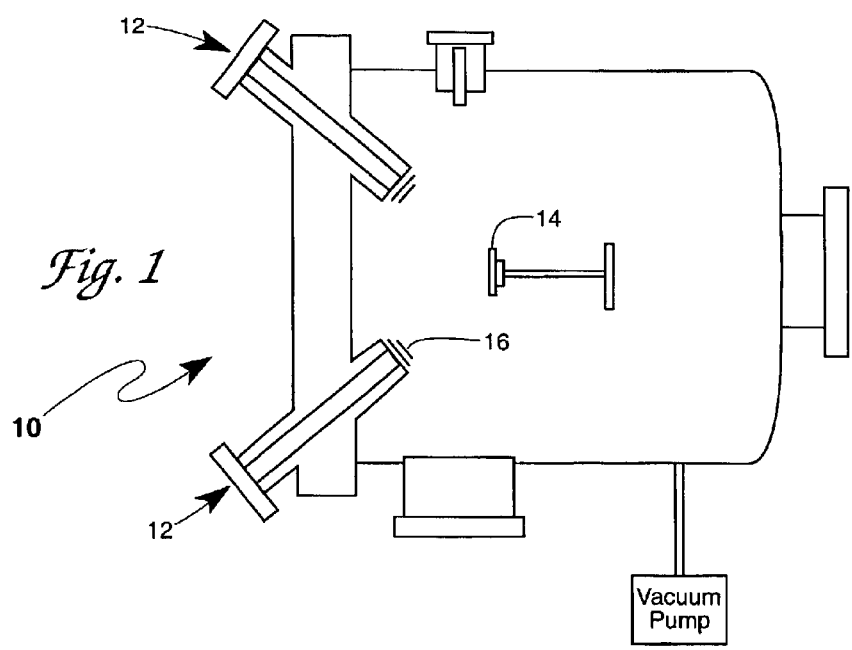
FIG. 1 is a simplified, diagrammatic view of a representative MBE growth chamber within a typical MBE system.

Reference is made to FIG. 1, diagrammatically showing a typical MBE growth chamber 10 suitable for performing the method of the present invention. While any of a number of commercially available MBE systems can be used in accordance with the present method, one MBE system providing satisfactory results is the Mod Gen II from Applied EPI, St. Paul, Minn., 55127. As is typical with standard MBE systems, the MBE growth chamber 10 includes a number of removable effusion cells, only two are shown in FIG. 1 for the sake of clarity and designated 12. Generally, each effusion cell 12 includes a heating filament and a thermocouple and receives a crucible loaded with solid source material prior to initiation of the MBE growth process. As shown, the effusion cells are directed toward a substrate 14. Shutters, diagrammatically illustrated as 16 are provided with each effusion cell to enable precise beam control therefrom. Gaseous materials for the MBE growth process can be delivered by tube through a suitably modified effusion cell. As with solid source material, shutters 16 are controllably actuated in order to initiate as well as cease the flux of material onto the substrate 14. A vacuum pump is provided to evacuate the growth chamber.

According to the method of the present invention, a substrate 14 is loaded into the MBE growth chamber 10. The choice of substrate material varies but is usually from the group of sapphire, silicon carbide, or silicon.

According to the method of the present invention, a first crucible is charged with a quantity of gallium and a second crucible is charged with a quantity of $C_{60}$. In an alternative embodiment of the present invention, and as will be described in more detail below, a third crucible may be utilized and charged with a quantity of aluminum. Each of the crucibles are installed into respective, standard Knudsen effusion cells that are then placed into the MBE growth chamber. A gaseous source of nitrogen is also provided and is directed into the MBE growth chamber via a shuttered effusion cell. The method of the present invention has been successfully demonstrated for two different nitrogen sources, ammonia ($NH_3$), and nitrogen gas ($N_2$), that is broken into atomic nitrogen ($N_1$) by radio frequency plasma prior to admission into the MBE growth chamber.

In order to perform the method of the present invention, the growth chamber is evacuated. The first effusion cell containing gallium is heated to a temperature in the range of about 850–1150° C. The third effusion cell containing aluminum, if used, is heated to at temperature in the range of about 900–1200° C. As stated above, the method of the present invention provides equally satisfactory results with ammonia or nitrogen gas. If ammonia is utilized, the flux range is about 20 to 200 Standard Cubic Centimeters per Minute (sccm). If nitrogen gas is utilized, the flux range is about 0.2 to 10.0 sccm.

Figure 2:
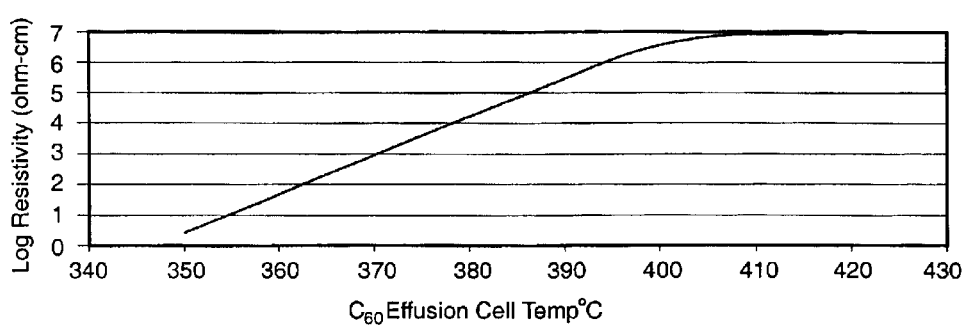
FIG. 2 is a graph showing the relationship between the temperature of the $C_{60}$ containing effusion cell versus log resistivity of the GaN film produced according to the method of the present invention.

Advantageously, a preselected, desired resistivity can be imparted in the GaN or AlGaN films grown according to my method. Reference is now made to FIG. 2, a graph showing the relationship between the temperature of the second effusion cell containing $C_{60}$ and the resistivity of the film thus grown (shown in logarithmic units for clarity). As shown, in the range of about 350 to 400° C., the resistivity increases from about 3 ohm-cm to about $3 \times 10^6$ ohm-cm. Above 400° C., the resistivity levels off above $1 \times 10^7$, beyond practicable measurement. Thus, depending on the desired resistivity of the GaN film, the effusion cell temperature of the second effusion cell containing $C_{60}$ is selected accordingly. The effusion cell temperature is set to a selected value from the range of about 200 to 700° C., again, depending on the preselected, desired resistivity of the GaN film. A typical temperature value for the second effusion cell is about 400° C. to assure the deposition of a high resistivity film.

Once the effusion cell source fluxes are set to their required values, the substrate is rotated from a loading position to a growth position, and heated to growth temperature. When ammonia is used as the nitrogen source, the substrate surface temperature is set in the range of between about 750–950° C. as measured using an optical pyrometer. Alternatively, when a nitrogen plasma source is used, then the substrate temperature is set in the range of between about 700–900° C.

A first wetting, or nucleation, layer is grown upon the substrate. This wetting layer is preferably either AlN or GaN, and typically has a thickness of 10–500 nm. It is applied to assure complete film bonding. While pre-wetted substrate wafers are commercially available, they are generally quite a bit more expensive than plain substrate wafers. Therefore, the wetting layer is often applied as a first step in the method of the present invention. Next, a buffer layer is grown, either GaN, AlGaN or AlN, and ranges in thickness from 100 nm to 5 μm. It is in this buffer layer that carbon doping is utilized to impart the desired resistivities. It is a distinct advantage of my invention that the resistivity of the film can be readily, precisely and consistently controlled by controlling the effusion cell temperature during the growth process.

While GaN films are the most commonly desired end product, AlGaN films have utility as well in applications such as a cladding layer around an optical device, like an Light Emitting Diode (LED) or laser and the method of the present invention produces satisfactory results here as well. Other desirable applications utilize AlGaN because it gives better isolation of transistor devices from the substrate due to its higher bandgap (compared to GaN).

In summary, numerous benefits have been described from utilizing the principles of the present invention. The method of the present invention utilizes solid source gallium, gas source nitrogen and solid source Buckminster Fullerene $C_{60}$ as the source of carbon dopant for the GaN film. A desired, predetermined GaN film resistivity is created during the growth process by selecting the temperature of the second effusion cell containing $C_{60}$ so as to impart the desired preselected resistivity to the GaN film.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

I claim:

1. A method of controlling the resistivity of a GaN film, comprising the steps of:

provided an MBE system having a growth chamber;

installing a substrate in said MBE growth chamber;

growing a film of GaN upon said substrate within said MBE system;

imparting a preselected resistivity in said GaN film during said growing step above by directing a carbon containing flux from an effusion cell loaded with a quantity of $C_{60}$ onto said substrate, said effusion cell being heated to a selected temperature to impart a desired preselected resistivity in said GaN film.

2. A method of controlling the resistivity of GaN, comprising the steps of:

providing an MBE system having a growth chamber and effusion cells having shutters;

installing a wetted substrate into the growth chamber;

charging a first crucible with a quantity of gallium;

charging a second crucible with a quantity of $C_{60}$;

providing a shuttered source of nitrogen flux;

installing said first crucible into a first effusion cell having shutters;

installing said second crucible into a second effusion cell having shutters;

placing said first and second effusion cells into the growth chamber;

evacuating said growth chamber;

heating said substrate;

heating said first effusion cell to a temperature in the range of about 850–1100° C.;

heating said second effusion cell to a selected temperature to impart a preselected desired resistivity in the GaN;

growing a resistive layer of GaN upon said substrate by controllably actuating said shutters of said first and second effusion cells and said source of nitrogen flux.

3. A method of controlling the resistivity of GaN, comprising the steps of:
  providing an MBE system having a growth chamber and effusion cells having shutters;
  installing a substrate into said MBE growth chamber;
  charging a first crucible with a quantity of gallium;
  charging a second crucible with a quantity of $C_{60}$;
  charging a third crucible with a quantity of aluminum;
  providing a shuttered source of nitrogen flux;
  installing said first crucible into a first effusion cell having shutters;
  installing said second crucible into a second effusion cell having shutters;
  installing said third crucible into a third effusion cell having shutters;
  placing said first, second and third effusion cells into the growth chamber;
  evacuating said growth chamber;
  heating said substrate;
  heating said first effusion cell to a temperature in the range of about 850–1100° C.;
  heating said second effusion cell to a selected temperature to impart a preselected desired resistivity in the GaN;
  heating said third effusion cell to a temperature in the range of about 900–1200° C.;
  growing a wetting layer of AlN upon said substrate by controllably actuating said shutters of said third effusion cell and said source of nitrogen flux; and,
  growing a resistive layer of GaN upon said substrate by controllably actuating said shutters of said first and second effusion cells and said source of nitrogen flux.

4. A method of controlling the resistivity of GaN, comprising the steps of:
  providing an MBE system having a growth chamber and effusion cells having shutters;
  installing a substrate into said MBE growth chamber;
  charging a first crucible with a quantity of gallium;
  charging a second crucible with a quantity of $C_{60}$;
  providing a shuttered source of nitrogen flux;
  installing said first crucible into a first effusion cell having shutters;
  installing said second crucible into a second effusion cell having shutters;
  placing said first and second effusion cells into the growth chamber;
  evacuating said growth chamber;
  heating said substrate;
  heating said first effusion cell to a temperature in the range of about 850–1100° C.;
  heating said second effusion cell to a selected temperature to impart a preselected desired resistivity in the GaN;
  growing a wetting layer of GaN upon said substrate by controllably actuating said shutters of said first effusion cell and said source of nitrogen flux; and,
  growing a resistive layer of GaN upon said substrate by controllably actuating said shutters of said first and second effusion cells and said source of nitrogen flux.

5. A method of controlling the resistivity of AlGaN, comprising the steps of:
  providing an MBE system having a growth chamber and effusion cells having shutters;
  installing a wetted substrate into the growth chamber;
  charging a first crucible with a quantity of gallium;
  charging a second crucible with a quantity of $C_{60}$;
  charging a third crucible with a quantity of aluminum;
  providing a shuttered source of nitrogen flux;
  installing said first crucible into a first effusion cell having shutters;
  installing said second crucible into a second effusion cell having shutters;
  installing said third crucible into a third effusion cell having shutters;
  placing said first, second and third effusion cells into the growth chamber;
  evacuating said growth chamber;
  heating said substrate;
  heating said first effusion cell to a temperature in the range of about 850–1100° C.;
  heating said second effusion cell to a selected temperature to impart a preselected desired resistivity in the AlGaN;
  heating said third effusion cell to a temperature in the range of about 900–1200° C.;
  growing a resistive layer of AlGaN upon said substrate by controllably actuating said shutters of said first, second and third effusion cells and said source of nitrogen flux.

6. A method of controlling the resistivity of GaN, comprising the steps of:
  providing an MBE system having a growth chamber and effusion cells having shutters;
  installing a substrate into said MBE growth chamber;
  charging a first crucible with a quantity of gallium;
  charging a second crucible with a quantity of $C_{60}$;
  charging a third crucible with a quantity of aluminum;
  providing a shuttered source of nitrogen flux;
  installing said first crucible into a first effusion cell having shutters;
  installing said second crucible into a second effusion cell having shutters;
  installing said third crucible into a third effusion cell having shutters;
  placing said first, second and third effusion cells into the growth chamber;
  evacuating said growth chamber;
  heating said substrate;
  heating said first effusion cell to a temperature in the range of about 850–1100° C.;
  heating said second effusion cell to a selected temperature to impart a preselected desired resistivity in the GaN;
  heating said third effusion cell to a temperature in the range of about 900–1200° C.;
  growing a wetting layer of AlN upon said substrate by controllably actuating said shutters of said first effusion cell and said source of nitrogen flux; and,
  growing a resistive layer of AlGaN upon said substrate by controllably actuating said shutters of said first, second and third effusion cells and said source of nitrogen flux.

7. A method of controlling the resistivity of AlGaN, comprising the steps of:
  providing an MBE system having a growth chamber and effusion cells having shutters;
  installing a substrate into said MBE growth chamber;
  charging a first crucible with a quantity of gallium;

charging a second crucible with a quantity of $C_{60}$;

charging a third crucible with a quantity of aluminum;

providing a shuttered source of nitrogen flux;

installing said first crucible into a first effusion cell having shutters;

installing said second crucible into a second effusion cell having shutters;

installing said third crucible into a third effusion cell having shutters;

placing said first, second and third effusion cells into the growth chamber;

evacuating said growth chamber;

heating said substrate;

heating said first effusion cell to a temperature in the range of about 850–1100° C.;

heating said second effusion cell to a selected temperature to impart a preselected desired resistivity in the GaN;

heating said third effusion cell to a temperature in the range of about 900–1200° C.;

growing a wetting layer of GaN upon said substrate by controllably actuating said shutters of said first effusion cell and said source of nitrogen flux; and, growing a resistive layer of AlGaN upon said substrate by controllably actuating said shutters of said first, second and third effusion cells and said source of nitrogen flux.

* * * * *